United States Patent
Martinelli et al.

(10) Patent No.: US 6,839,371 B1
(45) Date of Patent: Jan. 4, 2005

(54) COMBINED SINGLE-FREQUENCY LASER AND LINEAR AMPLIFIER

(75) Inventors: Ramon Ubaldo Martinelli, Hightstown, NJ (US); Alan Richard Sugg, Langhorne, PA (US); Raymond Joseph Menna, Newtown, PA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/562,407

(22) Filed: May 1, 2000

Related U.S. Application Data

(60) Provisional application No. 60/132,460, filed on May 4, 1999.

(51) Int. Cl.[7] ................................................. H01S 5/00
(52) U.S. Cl. .......................... 372/50; 372/43; 372/44; 372/45; 372/75
(58) Field of Search ............................ 372/43, 44, 45, 372/50, 75, 26, 28, 47, 48

(56) References Cited

U.S. PATENT DOCUMENTS

| | | | | |
|---|---|---|---|---|
| 4,744,089 A | * | 5/1988 | Montroll et al. | 372/50 |
| 5,732,102 A | | 3/1998 | Bouadma | 372/96 |
| 6,141,477 A | * | 10/2000 | Kitamura | 372/45 |
| 6,162,655 A | | 12/2000 | Johnson et al. | 438/31 |
| 6,188,708 B1 | | 2/2001 | Schmitt et al. | 372/43 |
| 6,285,694 B1 | * | 9/2001 | Shigihara | 372/45 |

FOREIGN PATENT DOCUMENTS

| | | | | |
|---|---|---|---|---|
| EP | 0 853 359 | | 7/1998 | ............ H01S/3/25 |
| JP | 6300909 | | 10/1994 | ............ G02B/5/18 |
| JP | 11-17276 A | * | 1/1999 | ............ H01S/3/18 |

OTHER PUBLICATIONS

Nakano, et al., "Fabrication and Characteristics of an Integrated DFB Laser/Amplifier Having Reactive–Ion–Etched Tilted End Facets", Japanese J. Applied Physics, 29 (12), Dec. 1990, L2430–L2433.

Dutta, et al., "Integrated distributed feedback laser and optical amplifier", Applied Physics Letters, 59 (14), Sep. 1991, 1676–1677.

Koren, et al., "Intergration of 1.3 $\mu$m wavelength lasers and optical amplifiers", Applied Physics Letter, 57(14), Oct. 1990, 1375–1377.

* cited by examiner

*Primary Examiner*—Don Wong
*Assistant Examiner*—Cornelius H Jackson
(74) *Attorney, Agent, or Firm*—William J. Burke

(57) ABSTRACT

A semiconductor laser device includes a substrate having on a surface thereof a semiconductor diode laser portion and a linear amplifier portion. Each of the laser portion and amplifier portion has a waveguide layer with the waveguide layers being in alignment. The laser portion is of a structure which permits it to generate radiation and emit the radiation from one end. The amplifier has an end that receives the radiation from the laser portion, and another end with emits the radiation after the radiation is amplified. The device emits FM radiation but not IM radiation.

12 Claims, 3 Drawing Sheets

COMBINED SINGLE-FREQUENCY LASER AND LINEAR AMPLIFIER

This application claims the benefit of U.S. Provisional Application Ser. No. 60/132,460 filed May 4, 1999.

GOVERNMENT SUPPORT

This invention was at least partially supported by the Government Contract No. F29601-97-C-0026. The government may have certain rights in this invention.

FIELD OF THE INVENTION

The present invention relates to a single-frequency laser, and more particularly, to a single frequency laser combined with a linear amplifier which permits frequency modulation (FM) without intensity modulation (IM).

BACKGROUND OF THE INVENTION

A particularly troublesome characteristic of single-frequency semiconductor diode lasers is that when the current or temperature of the laser is modulated, both the intensity of the output power and the frequency, or equivalently, the wavelength of the laser output radiation change. These changes are referred to as intensity modulation (IM) and frequency modulation (FM). Wavelength modulation is called WM. In the telecommunications industry, where the encoding technique is generally on-off keying, engineers would like laser to have all IM and no FM, for FM creates cross talk among the closely spaced wavelength-division-multiplexing channels of the system. Conversely, in trace gas sensing, one would like to frequency-modulate the laser without any variation in the intensity. IM creates interfering signals, and introduces noise into the measurement system. Therefore, it would be desirable to have a single-frequency laser that exhibits FM with either current or temperature tuning, while eliminating the IM.

SUMMARY OF THE INVENTION

A semiconductor laser includes a substrate having a surface. A single-frequency semiconductor laser diode is on a portion of the said surface of the substrate and has a radiation emitting end. An optical linear amplifier is on the remaining portion of the surface of the substrate. The amplifier has a radiation receiving end adjacent the radiation emitting end of the laser, and a radiation emitting end.

DETAILED DESCRIPTION OF PREFERRED EMBODIMENT

Figure 1:
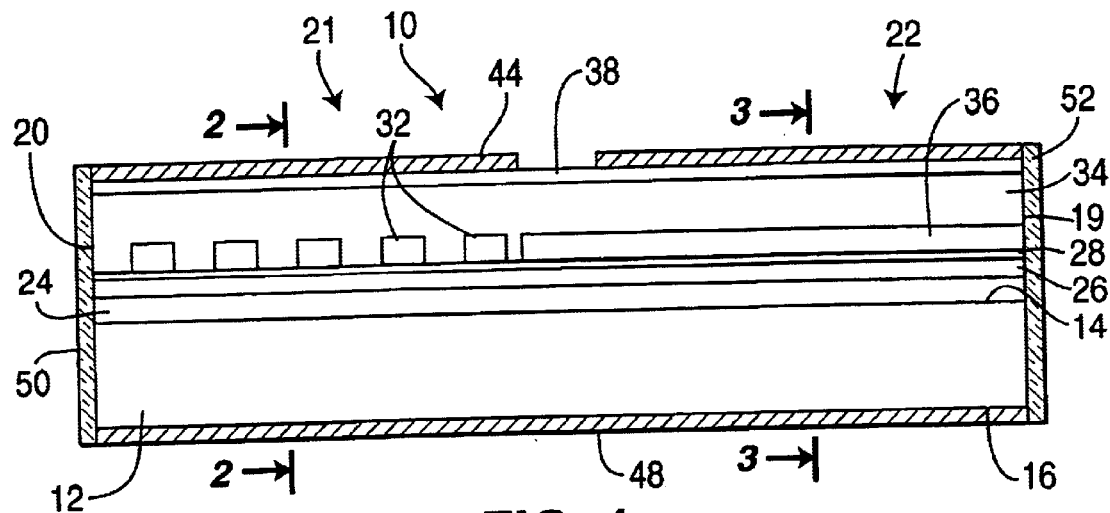
FIG. 1 is a side view of the laser of the present invention.
Figure 2:
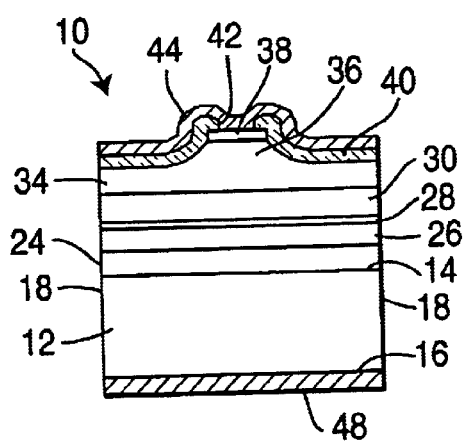
FIG. 2 is a sectional view along line 2—2 of FIG. 1.
Figure 3:
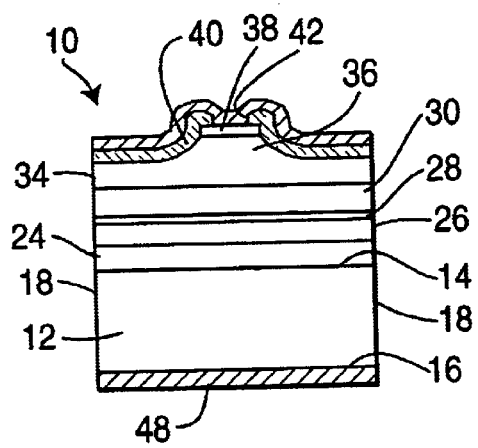
FIG. 3 is a sectional view along line-3—3 of FIG. 1.

Referring to FIGS. 1, 2 and 3, the semiconductor laser device of the present invention is generally designated as 10.

Laser device 10 comprises a substrate 12 of a semiconductor material of N-type conductivity. To form a single frequency semiconductor diode laser, the substrate 10 may be of InP. However, as is well known in the art, other suitable materials may be used. The substrate has a pair of substantially flat, opposed top and bottom surfaces 14 and 16, a pair of opposed side surfaces 18, and opposed end surfaces 19 and 20. On a portion of the top surface 14 of the substrate 12 is a diode laser 21, and on the remaining portion of the top surface 14 is a linear amplifier 22.

On and covering the top surface 14 of the substrate 12 is a clad layer 24 of N-type conductivity InP. If desired, a buffer layer (not shown) of N-type conductivity InP may be provided between the top surface 14 and the clad layer 24. On and covering the N-type clad layer 24 is an active and guide layer 26. The active and guide layer 26 may be of a single or multiple quantum well structure, which for example, can be alternating layers of InGaAs and InGaAsP. However, as well known in the art, other materials may be used for the active layer 26. On and covering the active and guide layer 26 is a spacer layer 28 of InP which is covered by a layer 30 of InGaAsP. In the diode laser portion 21 of the laser device 10, a first-order Bragg grating 32 is formed in the layer 30. However, in the linear amplifier portion 22 of the laser device 10, the layer 30 is left as a plain layer. On and covering the layer 30 is a clad layer 34 of P-type conductivity InP. The P-type clad layer 34 is formed with an upwardly projecting ridge 36 extending the full length of the P-type clad layer 34 and intermediate the sides 18 of the substrate 12. A highly conductive P+ type conductivity contact layer 38 of InGaAs is on the top surface of the ridge 36.

A layer 40 of an insulating material, such as silicon dioxide, is over the surface of the P-type clad layer 34 including the ridge 36 and contact layer 38. The insulating layer 40 has an opening 42 therethrough over the contact layer 38. A first metal contact layer 44 is over the insulating layer 40 and in the opening 42 to contact the contact layer 38. As shown in FIG. 1, the first metal contact layer 44 extends over the diode laser portion 21 of the laser device 10. A second metal contact layer is over the insulating layer 40 and in the opening 42 to contact the contact layer 38. As shown in FIG. 1, the second metal contact layer 46 extends over the linear amplifier portion 22 of the laser device 10 and is spaced from the first contact layer 44. A third metal contact layer 48 is over and completely covers the bottom surface 16 of the substrate 12.

Figure 4:
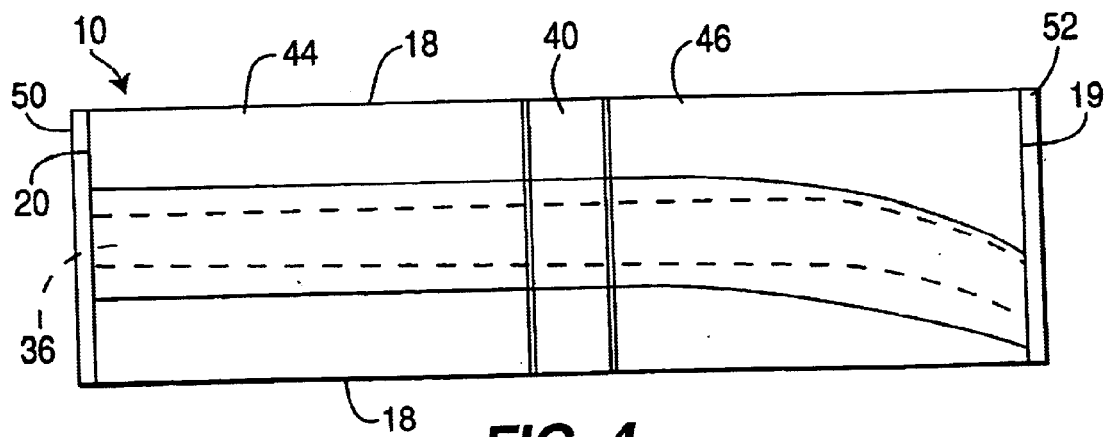
FIG. 4 is a top view of the laser of the present invention.

A layer 50 of a high reflection material is coated over he end surface 19 of the substrate 12 and the overlying diode laser portion 21. Layer 50 can be a multiple layer Bragg reflector. This provides a reflective coating on the back end of the diode laser portion 21 so as to promote single mode distributed feed back (DFB) operation A layer 52 of a low reflection material is coated over the end surface 20 of the substrate 12 and the overlying linear amplifier portion 22 of the laser device 10. This provides a partially transmitting front surface for the linear amplifier portion 22 to inhibit Fabry-Perot laser oscillations within the cavity defined between the end surfaces 19 and 20 and to allow radiation to be emitted from the laser device 10. As shown in FIG. 4, in the linear amplifier portion 22 of the laser device 10, the ridge 36 may be gently curved toward the end surface 20 so that it makes an angel of about 6 degrees with respect to the end surface 20. This assists in providing a low reflection at the end surface 20.

In the operation of the laser device 10, a current is placed across the diode laser 21 between the first contact 44 and the third contact 48, and a second and separate current is placed across the linear amplifier 22 between the second contact 46 and the third contact 48. When the current across the diode laser 21 reaches a threshold value, radiation is generated in the active layer 26. The radiation is guided along the active and guide layer 26 into the linear amplifier 22 where it is amplified and emitted from the amplifier 22 at the end surface 20 of the substrate 12. It should be understood that although the diode laser 21 and linear amplifier 22 are formed on a single substrate 12 and have common layers, including the active and guide layer 26, the diode laser has a radiation emitting end, and the linear amplifier 22 has a radiation receiving end. The light receiving end of the linear amplifier 22 faces and is in alignment with the light emitting end of the diode laser 21. Thus, the radiation generated in the diode laser 21 can flow into the linear amplifier 22.

Figure 5:
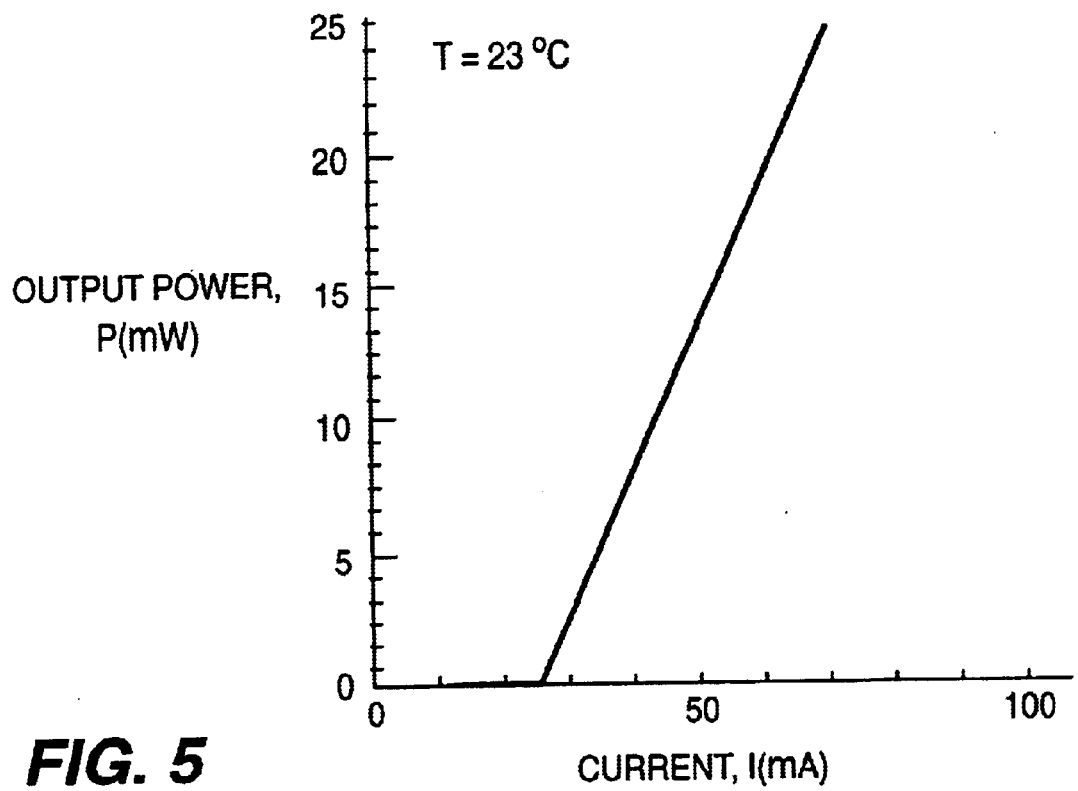
FIG. 5 is a graph showing the output power vs. applied current for a semiconductor laser diode.
Figure 6:
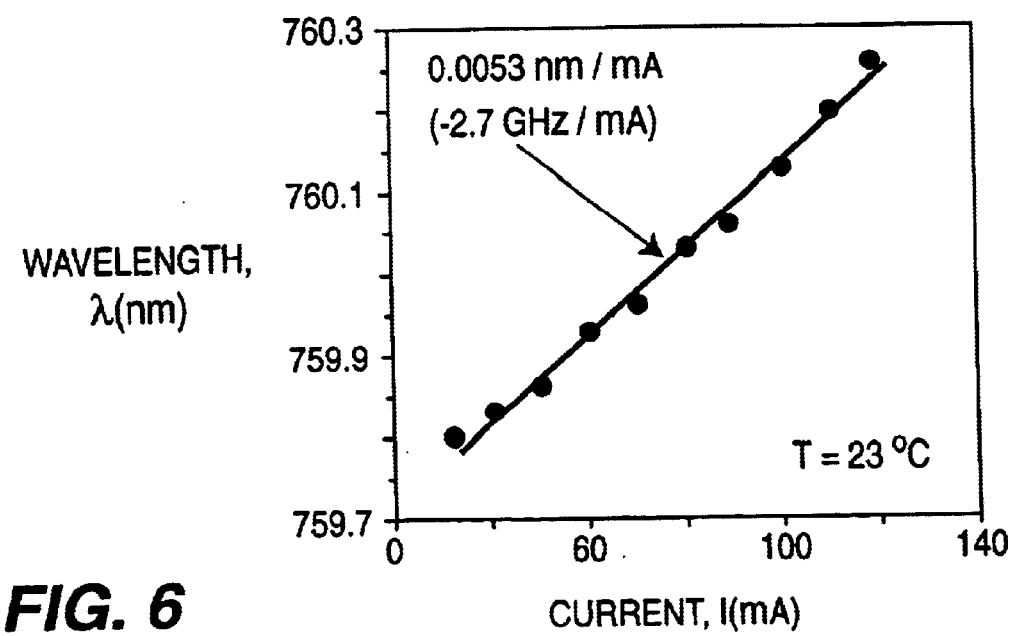
FIG. 6 is a graph showing the wavelength vs applied current for a semiconductor laser diode at a fixed heatsink temperature.
Figure 7:
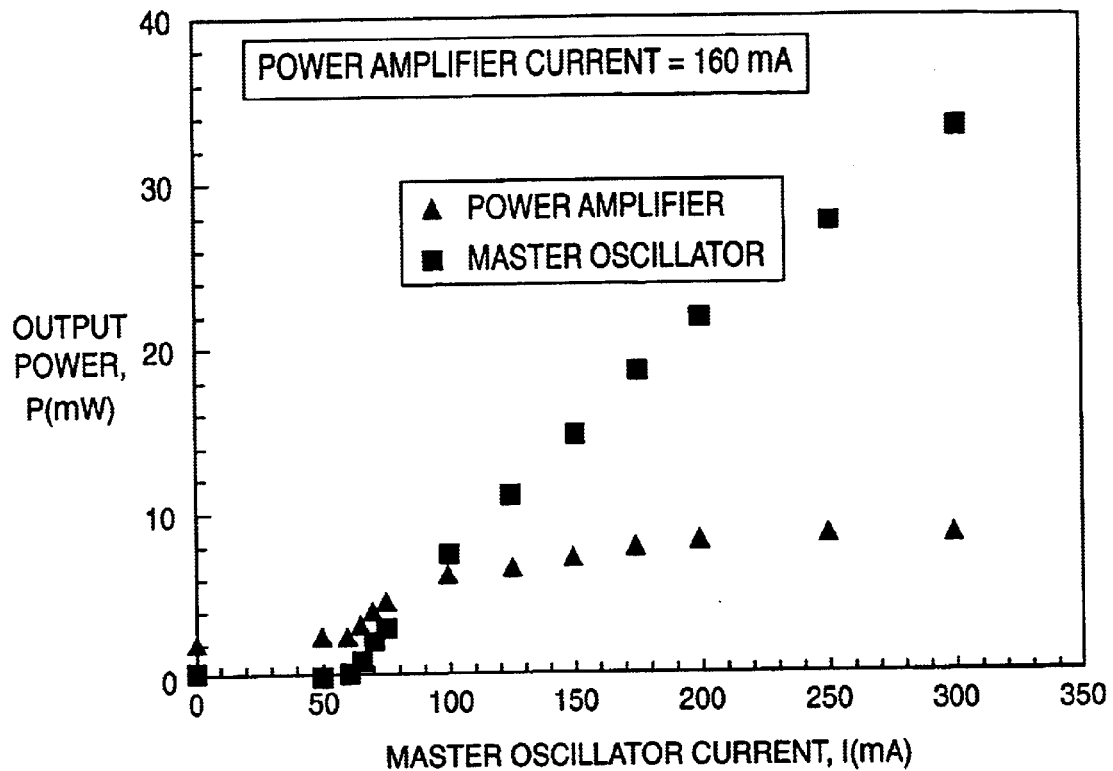
FIG. 7 is a graph showing the output powers from a laser and a linear amplifier vs. current applied to a laser whose output is fed into the amplifier.
Figure 8:
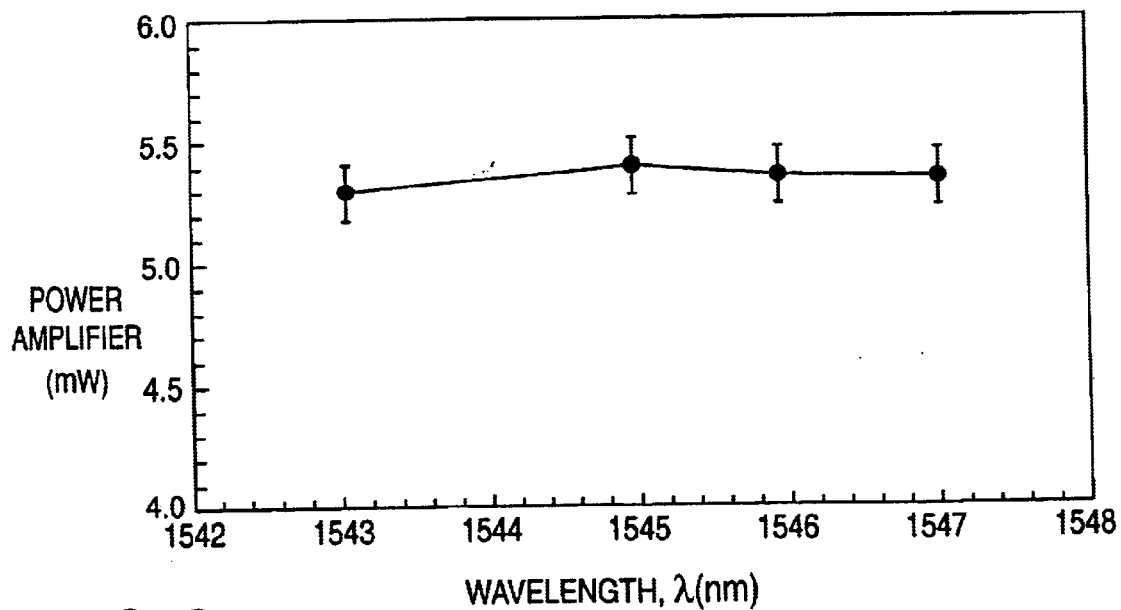
FIG. 8 is a graph showing the output power vs. wavelength for the device of the present invention.

The diode laser 21 has been described as a single frequency DFB laser, the characteristics of which are well known. When the diode laser 21 is above threshold, its output power increases with increasing current as shown in the graph of FIG. 5. Also, the lasing wavelength increases with increasing current as shown in the graph of FIG. 6. All DFB lasers behave in the manner shown in FIGS. 5 and 6 although their particular wavelength, threshold current, slope efficiency and tuning rate may differ with changes in structure and material. The characteristics of linear optical amplifiers are also well known. FIG. 7 shows the amplification characteristics of a laser and a linear ridge waveguide amplifier when a laser inputs single-frequency optical power into the amplifier, which has a constant bias current. As can be seen from FIG. 7, the output power of the amplifier strongly saturates when the laser input current reaches a certain value, while the output power of the laser does not saturate. This means that for laser currents greater than this value, the output of the amplifier will not change, whereas the wavelength, or frequency of the radiation will vary linearly with current as shown in FIGS. 5 and 6. Thus, it can be seen that with changes in the current applied to the diode laser 21, there will be a pure FM signal from the linear amplifier 22, which is the output of the diode device 10, without any IM. It is therefore an optical amplifier. The diode device 10 of the present invention can also be useful for use in gas sensing or similar purposes or in applications where the output optical power should be limited.

Thus there is provided by the present invention a laser device which emits FM radiation but not IM radiation. The laser device includes a distributed feed back ridged diode laser combined with a ridged linear amplifier, which acts as saturable amplifer. Although the laser device of the present invention has been described as being formed of layers of InP, InGaAsP, and InGaAs, the diode laser may be formed of other well known combinations of semiconductor materials which will provide desired generation and emission of radiation. The particular materials used will determine wavelength of the emitted radiation. Although a single laser is described, multiple lasers can act as imputs to the saturable amplifier using free space optics or optical fibers as coupling media. Alternatively, integrated ridge waveguides can couple the laser outputs into the saturable amplifier.

What is claimed is:

1. A semiconductor laser device comprising:
    a substrate of a semiconductor material having a first and second opposed surfaces;
    a single-frequency radiation emitting laser on a portion of the first surface of the substrate, said laser having contacts for receiving a current and a radiation emitting end for providing radiation in response to said current such that output power of said laser remains unsaturated; and
    a linear optical amplifier on a portion of said first surface of the substrate, said amplifier having a radiation receiving end adjacent the radiation emitting end of the laser for receiving said radiation, and a radiation emitting end opposite the radiation receiving end for providing amplified radiation in response to said radiation such that output power of said amplifier saturates.

2. The semiconductor laser device of claim 1 wherein the laser has a waveguide layer along which the radiation flows, and the amplifier has a waveguide layer along which the radiation flows and which is in alignment with the waveguide layer of the laser.

3. The semiconductor laser device of claim 2 further comprising a first clad layer of one conductivity type on and extending along the entire length of the first surface of the substrate, an active and guide layer of a semiconductor material on and extending along the entire length of the first clad layer, a first order Bragg grating on the active layer along the portion of the active layer in the laser portion of the device, and a second clad layer of the opposite conductivity type on and along the entire length of the active and guide layer, said second clad layer extending over the Bragg grating.

4. The semiconductor laser device of claim 3 wherein a first metal contact strip extends along the portion of the second layer which is in the laser portion, a second metal contact strip extends along the portion of the second clad layer on the linear amplifier portion, and a third metal contact is on the second surface of the substrate.

5. The semiconductor laser device of claim 4 wherein the second clad layer has a ridge projecting upwardly therefrom which ridge extends along the entire length of the second clad layer, the first contact strip is along a portion of the top surface of the ridge and the second contact strip is along another portion of the top surface of the ridge.

6. The semiconductor laser device of claim 5 including a layer of a semiconductor material between the active and guide layer and the second clad layer and extending the full length of the active layer, and the Bragg grating is formed in the portion of the said semiconductor layer which is in the laser portion of the device.

7. The semiconductor laser device of claim 6 wherein the substrate has opposed end surfaces, the various layers of semiconductor material forming the laser and the amplifier extending between said end surfaces, a radiation reflection coating is on the end surface of the substrate and the semiconductor layers at the laser end portion of the device, and a partially transparent coating is on the end surface of the substrate and the semiconductor layers at the amplifier end portion of the device.

8. The semiconductor laser device of claim 7 wherein in the amplifier portion of the device the ridge curves so that at the amplifier end of the device the ridge is at an angle of not more than 6 degrees with respect to said end surface.

9. The semiconductor laser device of claim 8 wherein the substrate and first clad layer is of N-type conductivity and the second clad layer is of P-type conductivity.

10. The semiconductor laser device of claim 9 wherein the active and guide layer is of a quantum well structure.

11. A method of producing an optical signal comprising:
    applying a current to a single-frequency radiation emitting laser disposed on a semiconductor substrate;
    producing an unsaturated output of the laser in response to the laser current;
    coupling the unsaturated output of the laser to a linear optical amplifier disposed on the semiconductor substrate;

producing a saturated output of the amplifier in response to the laser current.

12. The method of claim 11, further comprising:

varying the laser current to produce a frequency modulated (FM) optical signal at the unsaturated output; and amplifying the FM optical signal to produce an amplified FM optical signal without intensity modulation (IM) at the saturated output of the amplifier.

* * * * *